United States Patent [19]
Balitsky et al.

[11] 3,936,276
[45] Feb. 3, 1976

[54] PROCESS FOR PRODUCING AMETHYST CRYSTAL

[76] Inventors: Vladimir Sergeevich Balitsky, ulitsa Lenina, 12, kv. 39; Lev Nikolaevich Khetchikov, ulitsa Lenina, 12, kv. 13; Valentina Petrovna Orlova, ulitsa Krasnoi Molodezhi, 4, kv. 47; Ljudmila Vasilievna Balitskaya, ulitsa Lenina, 12, kv. 39, all of Vladimirskaya oblast, Alexandrov, U.S.S.R.

[22] Filed: Dec. 6, 1973

[21] Appl. No.: 422,162

[52] U.S. Cl. .............. 23/301 R; 23/300; 423/335; 423/339; 106/42; 252/62.9
[51] Int. Cl. .... B01j 17/04; C01b 33/12; B01j 17/36
[58] Field of Search .......... 23/300, 301 R; 423/335, 423/339, 334, 264; 106/42; 252/62.9

[56] References Cited
UNITED STATES PATENTS

| | | | |
|---|---|---|---|
| 2,468,761 | 5/1949 | Kjellgren | 23/301 R |
| 2,508,208 | 5/1950 | Wooster | 23/301 R |
| 2,543,071 | 2/1951 | Slawson | 23/301 R |
| 2,674,520 | 4/1954 | Sobek | 23/301 R |
| 2,680,677 | 6/1954 | Broge | 23/301 R |
| 2,871,192 | 1/1959 | Augustine | 23/301 R |
| 2,923,604 | 2/1960 | Jaffe | 23/301 R |
| 3,291,575 | 12/1966 | Sawyer | 23/301 R |
| 3,394,081 | 7/1968 | Ballman | 23/301 R |
| 3,576,608 | 4/1971 | Gehres | 23/301 R |
| 3,832,146 | 8/1974 | Bresnahan | 23/301 R |

FOREIGN PATENTS OR APPLICATIONS

| | | | |
|---|---|---|---|
| 797,203 | 6/1958 | United Kingdom | 23/301 R |
| 682,203 | 11/1952 | United Kingdom | 23/301 R |
| 1,003,606 | 11/1951 | France | 23/301 R |

OTHER PUBLICATIONS

Brown et al., Nature, Jan. 5, 1952, Vol. 169, pp. 35-36.
White, Endeavorer, Apr. 1962, The Synthesis and Uses of Artificial Gemstones, pp. 73-84.
U.S. Patent 2,484,829, 10/49, Holden.
Tzinober et al., "Kristallographizer," Journal, 4, 633, 1959.

*Primary Examiner*—Norman Yudkoff
*Assistant Examiner*—S. J. Emery
*Attorney, Agent, or Firm*—Holman & Stern

[57] ABSTRACT

A process for producing amethyst crystals which involves growing colourless quartz crystals by a hydrothermal method of a temperature drop in a high-pressure autoclave on crystalline quartz seed plates oriented parallel to pinacoid crystallographic planes {0001} or to planes inclined to said pinacoid planes at an angle of up to 15° with the use of silica as a charge, said growing being effected from aqueous solutions of ammonium fluoride with a concentration of from 5 to 30% by weight and containing iron introduced into the autoclave in the form of its oxydic or hydroxydic compounds in an amount ranging from 5 to 30 g/l of the solution. Said growing of colourless quartz crystals is effected at a crystallization temperature within the range of from 150° to 500°C under a pressure of from 10 to 1,200 kg/cm$^2$ and at a crystal growth rate of from 0.05 to 1.5 mm/day. It is preferable to introduce inorganic compounds of lithium or sodium into the autoclave, prior to the crystal growing, in an amount ranging from 0.5 to 2.0 g/l of the solution. The resulting grown colourless quartz crystals are exposed to an ionizing radiation. In the process of the present invention the crystal growing is effected under specified physico-chemical process parameters enabling a good reproducibility of said process. Crystal growth rates are high enough and the process according to the present invention makes it possible to produce amethyst crystals with a high colour purity (without any smoky tint) and with no cracks whatsoever.

7 Claims, No Drawings

PROCESS FOR PRODUCING AMETHYST CRYSTAL

BACKGROUND OF THE INVENTION

The present invention relates to processes for the production of amethyst crystals which find an extensive use in jeweller's art as semi-precious stones.

Known in the art is a process for producing amethyst crystals by growing colourless quartz crystals using a hydrothermal method of a temperature drop in a high-pressure autoclave on crystalline seed plates oriented parallel to crystallographic planes of the major {1011} rhombohedron or the minor {1101} rhombohedron and with the use of silica as a charge; the crystal growth is effected from aqueous solutions of potassium carbonates containing iron introduced into the autoclave in the form of metallic iron; the thus-grown colourless quartz crystals are exposed to an ionizing radiation.

This prior art process for amethyst crystal growing has the following disadvantages:

1. Rather poor reproducibility of the process of growing colourless quartz crystals due to non-specified process parameters, namely crystallization temperature and pressure in the autoclave.
2. Relatively low growing rates (of the order of 0.005 to 0.02 mm/day) of colourless quartz crystals on seed plates of said crystallographic orientations.
3. Insufficient purity of amethyst crystal colour. This may be attributed to the fact that during growing colourless quartz crystals from aqueous solutions of potassium carbonate said crystals intensively entrain aluminium accumulated in such solutions as a result of the charge dissolution. The aluminium forms, in the colourless quartz crystals, potential centers of the smoky colour which after the exposure to an ionizing radiation result in the formation of a smoky tint in amethyst crystals, whereby the value of the amethyst crystals is substantially reduced.
4. Considerable fracturing of the amethyst crystals.

SUMMARY OF THE INVENTION

It is an object of the present invention to provide a process for producing amethyst crystals, wherein the growing of colourless quartz crystals would be effected under specified physico-chemical process parameters, whereby a good reproducibility of the process could be ensured.

It is another object of the present invention make it possible to substantially increase the growth rates of colourless quartz crystals.

Still another object of the present invention is to provide such a process which would enable the production of amethyst crystals with a high colour purity (without a smoky tint).

A further object of the present invention is to provide such a process which would make it possible to produce amethyst crystals without cracks.

These and other objects of the present invention are accomplished by growing colourless quartz crystals by a hydrothermal method of a temperature drop in a high-pressure autoclave on crystalline quartz seed plates oriented parallel to pinacoid crystallographic planes {0001} or to planes inclined to said pinacoid planes at an angle of up to 15° using silica as a charge; said growing is effected from aqueous solutions of ammonium fluoride with a concentration of from 5 to 30% by weight and containing iron introduced into the autoclave in the form of its oxydic and hydroxydic compounds in an amount ranging from 5 to 30 g/l of the solution; said growing of colourless quartz crystals is effected at a crystallization temperature ranging from 150° to 500°C, under a pressure within the range of from 10 to 1,200 kg/cm$^2$ at a crystal growth rate of from 0.05 to 1.5 mm/day; the grown colourless quartz crystals are exposed to an ionizing radiation.

Said conditions of crystal growing enable the production of colourless quartz crystals and, consequently, high-quality amethyst crystals. The process of crystal growing is well reproducible due to specified physico-chemical parameters thereof.

Analysis of crystals grown from aqueous solutions of ammonium fluoride on the seed plates of the above-mentioned orientations according to the present invention has shown that on said seed plates the crystals grow by way of regeneration, becoming coated with numerous minor (up to 1 mm) faces of a trigonal dipyramid. Therewith, a built-up crystal layer consisting of a combination of such dipyramids does not lose its integrity, while the crystal growth rate exceeds by 10 to 70 times that of crystals grown from aqueous solutions of potassium carbonate at the same crystallization temperatures and pressures on seed plates oriented parallel to crystallographic planes of the major and minor rhmobohedrons.

As it has been mentioned hereinbefore, in the process of the present invention iron is introduced into the autoclave in the form of its oxydic or hydroxydic compounds. This accounts for the presence, in the ammonium fluoride solution, of iron in a trivalent condition which is necessary, as it is well known, for the formation of potential centers of violet (amethyst) colour in the colourless quartz crystals. Under the action of an ionizing irradiation upon said crystals, these potential centers give rise to the formation of amethyst colour centers imparting violet colour to the colourless quartz crystals.

The introduction of metallic iron into the autoclave as in the prior art method is excluded, since metallic iron reacts with ammonium fluoride with the evolution of hydrogen, whereby a reducing medium is created in the autoclave thus preventing iron from transition into a trivalent state.

The process of the present invention makes it possible to produce high-purity colour amethyst crystals. This may be attributed to the fact that aluminium accumulated in aqueous solutions of ammonium fluoride upon dissolution of a charge forms a stable hexafluoride complex in these solutions. But even in the case where aluminium is incorporated into the growing crystals, there is no formation, therein, of aluminium-alkali centers of a smoky colour, but there are formed, as proven by optic- and radiospectroscopic analysis, aluminium-hydrogen defects which are not developed within the visible spectrum region after the exposure to an ionizing radiation. Therefore, the presence of aluminium in aqueous solutions of ammonium fluoride does not hinder the formation of amethyst crystals with a high colour purity (without a smoky tint). Since, as mentioned hereinabove, the source of aluminium in the solutions is represented by the soluble charge and since aluminium in the process of the present invention does not hinder the formation of high-quality amethyst crystals, the charge may be made of crystalline quartz or other polymorphic varieties of crystalline silica as well as amorphous silica without limitations as to the content of the aluminium impurity in the charge.

It should also be noted that an essential feature of the crystals grown from aqueous solutions of ammonium fluoride on seed plates oriented parallel to the pinacoid crystallographic planes or to the planes inclined to said pinacoid planes at an angle of up to 15° resides in a total absence of cracks.

As mentioned hereinbefore, iron is introduced into the autoclave in the form of its oxydic or hydroxydic compounds. Among the oxydic compounds of iron it is most preferred to employ ferric oxide $Fe_2O_3$ and among hydroxydic ones - ferric hydroxide $Fe(OH)_3$.

It is advisable that the growing of colourless quartz crystals be effected from aqueous solutions of ammonium fluoride with a concentration of from 10 to 15% by weight; oxydic or hydroxydic iron compounds should be charged into the autoclave in an amount of from 15 to 20 g/l of the solution and the growing of said crystals should be conducted at a crystallization temperature within the range of from 300° to 350°C under a pressure ranging from 100 to 240 kg/cm² and at a crystal growth rate of from 0.25 to 0.5 mm/day.

At a long period of growing the colourless quartz crystals there occurs an irreversible breakdown of potential colour centers due to the instability of these potential centers of amethyst colour against the action of elevated temperatures (300° to 500°C) within the growth zones adjacent to a seed plate. Such zones do not become violet coloured after the exposure to an ionizing radiation.

In order to prevent said potential colour centers from the thermal breakdown and to produce amethyst crystals with a uniform colour over the entire volume of the crystals, it is advisable that, prior to the growing of the colourless quartz crystals, inorganic compounds of lithium or sodium be introduced into the autoclave in an amount of from 0.5 to 2 and preferably 1 g/l of the ammonium fluoride solution.

As the inorganic compounds of lithium and sodium it is advisable to employ fluorides, nitrites or nitrates of these metals.

DETAILED DESCRIPTION OF THE PREFERRED EMBODIMENTS

The process for producing amethyst crystals according to the present invention is embodied in the following manner.

A nutrient charge is placed in a high-pressure autoclave viz. into its bottom portion-dissolution chamber. The autoclave is provided with a protective lining such as made of copper or polytetrafluoroethylene. The charge may be made of any polymorphic modifications of crystalline silica such as naturally-occurring vein quartz, quartz sand, synthetic quartz, cristobalite or tridymite, as well as amorphous silica. After placing the charge into the autoclave, a perforated transverse partition is mounted inside the autoclave to separate the dissolution chamber from the upper portion of the autoclave comprising a growth chamber. Thereafter, the growth chamber is equipped with crystalline quartz seed plates oriented parallel to pinacoid crystallographic planes {0001} or to planes inclined to said pinacoid planes at an angle of up to 15°.

After placing the charge and seed plates, the autoclave is fed with an aqueous solution of ammonium fluoride with a concentration of from 5 to 30% by weight. Prior to the performance of the crystal growing process, additives of oxydic or hydroxydic iron compounds (such as $FeO$, $Fe_2O_3$, $Fe_3O_4$; $Fe(OH)_2$, $Fe(OH)_3$) are charged into the autoclave in an amount ranging from 5 to 30 g/l of the solution and, when required, the autoclave contents is incorporated with additives of inorganic compounds of lithium or sodium such as fluorides, nitrites, nitrates, carbonates, sulphates, oxides or hydroxides of said metals in an amount of from 0.5 to 2.0 g/l of the solution.

On completion of charging, the autoclave is hermetized and set under predetermined growth conditions (the term growth conditions as used herein means crystallization temperature, pressure in the autoclave, aand crystal growth rate). As it has been mentioned hereinbefore, the growing of colourless quartz crystals is effected at a crystallization temperature within the range of from 150° to 500°C, under a pressure of from 10 to 1,200 kg/cm² and a crystal growth rate of from 0.05 to 1.5 mm/day. The predetermined growth conditions are maintained in the autoclave during the entire cycle period. The cycle duration $\tau$ (expressed in days) is calculated according to the formula: $\tau = d/v$, wherein $d$ (mm) represents a given thickness of a crystalline quartz layer to be grown-up on a seed plate, and $v$ (mm/day) is the rate of growth on the seed plate of a given orientation. On completion of the growing cycle, the autoclave heating is discontinued, and the autoclave is cooled to room temperature, whereupon colourless quartz crystals are discharged therefrom. To colour the crystals with a violet (amethyst) colour, they are exposed to an ionizing radiation ($\gamma$-rays, hard X-rays, accelerated electrons) with a dose ranging from $1 \times 10^3$ to $1 \times 10^7$ and preferably from $5 \times 10^5$ to $1 \times 10^6$ r.

For a better understanding of the present invention the following examples illustrating the production of amethyst crystals are given hereinbelow.

EXAMPLE 1

Into a copper-lined high-pressure autoclave there were placed a charge, viz. amorphous silica, crystalline seed plates oriented parallel to planes inclined to pinacoid crystallographic planes {0001} at an angle of 7°; thereafter, into the autoclave was poured an aqueous solution of ammonium fluoride of a 5% by weight concentration with ferrous oxide $FeO$ added in an amount of 5 g/l of the solution. The growing of colourless quartz was effected at a crystallization temperature of 500°C, under a pressure of 1,200 kg/cm² and a crystal growth rate of 1.5 mm/day.

The thus-grown colourless crystals were transparent and had no cracks. These crystals were exposed to $\gamma$-radiation using a $Co^{60}$ source with an irradiation dose of $1 \times 10^6$ r. After the irradiation, the crystals were coloured in the external zone of a 1.5 mm. thickness with a high-pure violet colour (with no smoky tint).

EXAMPLE 2

Into a high-pressure autoclave lined with polyfluorotetraethylene there were placed a charge, viz. cristobalite, crystalline quartz seeding plates oriented parallel to planes inclined to pinacoid crystallographic planes {0001} at an angle of 15°; thereafter into the autoclave was poured an aqueous solution of ammonium fluoride having a concentration of 30 per cent by weight with iron hydroxide $Fe(OH)_3$ added in an amount of 10 g/l of the solution. The growing of colourless quartz crystals was effected at a crystallization temperature of 150°C, under a pressure of 10 kg/cm² and a crystal growth rate of 0.05 mm/day.

The thus-grown colourless crystals were transparent and exhibited no cracks. These crystals were exposed to γ-radiation with a dose of $3 \times 10^4$ r. After the irradiation the crystals were coloured in the two-millimeter external zone with a pale violet colour (with no smoky tint).

EXAMPLE 3

Into a copper-lined high-pressure autoclave there were placed a charge (naturally-occurring crystalline quartz), crystalline quartz seed plates oriented parallel to pinacoid crystallographic planes {0001}: then there was poured an aqueous solution of ammonium fluoride with a concentration of 10% by weight and ferric oxide $Fe_2O_3$ in an amount of 20 g/l of the solution. The growing of colourless quartz crystals was effected at a crystallization temperature of 350°C, under 240kg/cm² pressure and a crystal growth rate of 0.5 mm/day.

The thus-grown colourless crystals were transparent and had no cracks. After irradiation with γ-rays of a dose of $5 \times 10^5$ r. these crystals were coloured in the external 1.5 mm thickness zone with a dark-violet colour of a high purity (with no smoky tint).

EXAMPLE 4

Into a copper-lined high-pressure autoclave there were placed a charge (naturally-occurring crystalline quartz), crystalline quartz seed plates oriented parallel to pinacoid crystallographic planes, an aqueous ammonium fluoride solution of a 10% by weight concentration, ferric oxide $Fe_2O_3$ in an amount of 30 g/l of the solution, and lithium fluoride LiF in an amount of 2 g/l of the solution. The growing of colourless quartz crystals was effected at a crystallization temperature of 350°C, under a pressure of 240 kg/cm² and a crystal growth rate of 0.35 mm/day.

The thus-grown crystals were transparent and contained no cracks. After the exposure to γ-radiation with a dose of $1 \times 10^6$ r these crystals acquired a dark-violet colour of a high purity (with no smoky tint) uniformly distributed within the entire crystal volume.

EXAMPLE 5

Into a copper-lined high-pressure autoclave there were placed a charge (naturally occurring crystalline quartz), crystalline quartz seed plates oriented parallel to pinacoid crystallographic planes {0001}, an aqueous solution of ammonium fluoride with a concentration of 10% by weight, ferrous hydroxide $Fe(OH)_2$ in an amount of 5 g/l of the solution, and sodium fluoride NaF in an amount of 0.5 g/l of the solution. The growing of colourless crystals was effected at a crystallization temperature of 350°C, under a pressure of 240 kg/cm² and a crystal growth rate of 0.4 mm/day.

The thus-grown crystals were transparent and contained no cracks. After exposure to γ-radiation with a dose of $1 \times 10^6$ r these crystals were coloured with a high-pure violet colour (with no smoky tint) uniformly distributed within the entire volume of the crystals.

EXAMPLE 6

Into a copper-lined high-pressure autoclave there were placed a charge (naturally-occurring crystalline quartz), crystalline quartz seed plates oriented parallel to pinacoid crystallographic planes {0001}, an aqueous solution of ammonium fluoride with a concentration of 10% by weight, ferric oxide $Fe_2O_3$ in an amount of 15 g/l of the solution and lithium nitrite $LiNO_2$ in an amount of 1 g/l of the solution. The growing of colourless quartz crystals was effected at a crystallization temperature of 350°C, under a pressure of 240 kg/cm² and a crystal growth rate of 0.5 mm/day.

The thus-grown colourless crystals were transparent and contained no cracks. After exposure to γ-radiation with a dose of $1 \times 10^6$ r these crystals were coloured with a pale-violet colour of a high purity (with no smoky tint) uniformly distributed over the entire volume of the crystals.

EXAMPLE 7

In a copper-lined high-pressure autoclave there were placed a charge (naturally-occurring quartz), crystalline quartz seed plates oriented parallel to pinacoid crystallographic planes {0001}, an aqueous solution of ammonium fluoride with a concentration of 10% by weight, ferric hydroxide in an amount of 10 g/l of the solution and lithium nitrate $LiNO_3$ in an amount of 2 g/l of the solution. The growing of colourless quartz crystals were effected at a crystallization temperature of 350°C, under a pressure of 240 kg/cm² and a crystal growth rate of 0.42 mm/day.

The thus-grown colourless crystals were transparent and contained no cracks. After exposure to γ-radiation with a dose of $1 \times 10^6$ r these crystals were coloured with a high-pure dark-violet colour (with no smoky tint) uniformly distributed over the entire volume of the crystals.

EXAMPLE 8

Into a polytetrafluoroethylene-lined high-pressure autoclave there were placed a charge (synthetic quartz containing $1.10^{-2}$ wt.% of aluminium), crystalline quartz seed plates oriented parallel to planes inclined to pinacoid crystallographic planes {0001} at an angle of 1°, an aqueous solution of ammonium fluoride with a concentration of 15% by weight, ferric-ferrous oxide $Fe_3O_4$ in an amount of 20 g/l of the solution and sodium nitrite $NaNO_2$ in an amount of 1.5 g/l of the solution. The growing of colourless quartz crystals was effected at a crystallization temperature of 300°C under a pressure of 100 kg/cm² and a crystal growth rate of 0.25 mm/day.

The thus-grown colourless crystals were transparent and contained no cracks. After exposure to γ-radiation with a dose of $1 \times 10^6$ these crystals were coloured with a violet colour without any smoky tint.

EXAMPLE 9

Into a copper-lined high-pressure autoclave there were placed a charge (naturally-occurring crystalline quartz), crystalline quartz seed plates oriented parallel to pinacoid crystallographic planes {0001}, an aqueous solution of ammonium fluoride with a concentration of 8% by weight, naturally-occurring hematite ($Fe_2O_3$) in an amount of 20 g/l of the solution and sodium nitrate $NaNO_3$ in an amount of 2 g/l of the solution. The growing of colourless quartz crystals was effected at a crystallization temperature of 400°C, under a pressure of 500 kg/cm² and a crystal growth rate of 0.45 mm/day.

The thus-grown colourless crystals were transparent and contained no cracks. After exposure to γ-radiation with a dose of $1.10^6$ r these crystals were coloured with a violet colour without any smoky tint.

EXAMPLE 10

Into a copper-lined high-pressure autoclave there were placed a charge (naturally-occurring quartz), quartz crystalline seed plates oriented parallel to planes inclined to pinacoid crystallographic planes {0001} at an angle of 3°, an aqueous ammonium fluoride solution of a 10% concentration, ferric oxide $Fe_2O_3$ in an amount of 30 g/l of the solution and lithium hydroxide LiOH in an amount of 1 g/l of the solution. The growing of colourless quartz crystals was effected at a crystallization temperature of 320°C, under a pressure of 700 kg/cm² and a crystal growth rate of 0.3 mm/day.

The thus-grown colourless crystals were transparent and contained no cracks. After the exposure to $\gamma$-radiation with a $6 \times 10^5$ r these crystals were coloured with a high-purity violet colour (with no smoky tint) uniformly distributed over the entire volume of the crystals.

EXAMPLE 11

Into a copper-lined high-pressure autoclave there were placed a charge (naturally-occurring crystalline quartz), crystalline quartz seed plates oriented parallel to pinacoid crystallographic planes {0001}, an aqueous solution of ammonium fluoride with a concentration of 10% by weight, ferric hydroxide $Fe(OH)_3$ in an amount of 7 g/l and sodium oxide $Na_2O$ in an amount of 0.5 g/l of the solution. The growing of colourless quartz crystals was effected at a crystallization temperature of 400°C under a pressure of 100 kg/cm² and a crystal growth rate of 0.8 mm/day.

The thus-grown colourless crystals were transparent and contained no cracks. After exposure to $\gamma$-radiation with a dose of $1 \times 10^6$ r these crystals were coloured with a violet colour without any smoky tint.

EXAMPLE 12

Into a copper-lined high-pressure autoclave there were placed a charge (naturally-occurring quartz), crystalline quartz seed plates oriented parallel to pinacoid crystallographic planes {0001}, an aqueous solution of ammonium fluoride with a concentration of 10% by weight, ferric oxide $Fe_2O_3$ in an amount of 20 g/l and lithium carbonate $Li_2CO_3$ in an amount of 1 g/l of the solution. The growing of colourless quartz crystals was effected at a crystallization temperature of 450°C under a pressure of 900 kg/cm² and a crystal growth rate of 0.85 mm/day.

The thus-grown colourless crystals were transparent and contained no cracks. After exposure to $\gamma$-radiation with a dose of $5 \times 10^5$ r these crystals were coloured with a high-purity violet colour with no smoky tint uniformly distributed over the entire volume of the crystals.

What is claimed is:

1. A process for producing amethyst crystals which comprises: introducing into a high-pressure autoclave a silica charge, crystalline quartz seed plates oriented parallel to pinacoid crystallographic planes {0001} or to planes inclined to said pinacoid planes at an angle up to 15° and an aqueous solution of ammonium fluoride with a concentration of from 5 to 30% by weight and containing iron in the form of its oxydic and hydroxydic compounds in an amount of from 5 to 30 g/l of the solution; growing colourless quartz crystals on the seed plates in the autoclave at a crystallization temperature within the range of from 150° to 500°C under a pressure of from 10 to 1,200 kg/cm² and at a crystal growth rate of from 0.05 to 1.5 mm/day; and exposing the resulting colourless quartz crystals to an ionizing radiation.

2. The process as claimed in claim 1, wherein the oxydic iron compound is ferric oxide $Fe_2O_3$.

3. The process as claimed in claim 1, wherein the hydroxydic compound is ferric hydroxide $Fe(OH)_3$.

4. The process as claimed in claim 1, wherein the concentration of the aqueous solution of ammonium fluoride ranges from 10 to 15% by weight; said iron compounds are added in an amount of from 15 to 20 g/l of the solution; and the growing of said crystals being effected at a crystallization temperature ranging from 300° to 350°C under a pressure of from 100 to 240 kg/cm² and at a crystal growth rate of from 0.25 to 0.5 mm/day.

5. The process as claimed in claim 1, further comprising the step of introducing inorganic compounds of metals selected from the group consisting of lithium and sodium into the autoclave in an amount of from 0.5 to 2 g/l of the ammonium fluoride solution prior to the growing of said colourless quartz crystals.

6. The process as claimed in claim 5, wherein the inorganic compounds of said metals are introduced into the autoclave in the amount of 1 g/l of the ammonium fluoride solution.

7. The process as claimed in claim 5, wherein the inorganic compounds are selected from the group consisting essentially of fluorides, nitrites and nitrates of said metals.

* * * * *